US012804876B2

(12) United States Patent
Yan

(10) Patent No.: US 12,804,876 B2
(45) Date of Patent: Nov. 17, 2026

(54) SEMICONDUCTOR DEVICE AND METHOD OF FORMING THE SAME

(71) Applicant: Fujian Jinhua Integrated Circuit Co., Ltd., Quanzhou City (CN)

(72) Inventor: Yifei Yan, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 422 days.

(21) Appl. No.: 18/531,717

(22) Filed: Dec. 7, 2023

(65) Prior Publication Data

US 2025/0038142 A1 Jan. 30, 2025

(30) Foreign Application Priority Data

Jul. 24, 2023 (CN) ......................... 202310916278.2

(51) Int. Cl.

*H10B 12/00* (2023.01)
*H10W 72/90* (2026.01)
*H10W 80/00* (2026.01)
*H10W 90/00* (2026.01)

(52) U.S. Cl.

CPC ......... *H10B 12/0335* (2023.02); *H10B 12/50* (2023.02); *H10W 72/936* (2026.01); *H10W 72/9445* (2026.01); *H10W 80/732* (2026.01); *H10W 80/743* (2026.01); *H10W 90/796* (2026.01)

(58) Field of Classification Search

CPC .. H10B 12/0335; H10B 12/50; H10B 12/315; H10W 72/9445; H10W 80/732; H10W 90/796; H10W 72/936

USPC .......................................................... 257/734

See application file for complete search history.

(56) References Cited

U.S. PATENT DOCUMENTS 11,411,010 B2 8/2022 Seong
12,363,885 B2 7/2025 Zhang
2008/0203456 A1 8/2008 Kim
2011/0095348 A1* 4/2011 Chakihara .............. H10B 41/30 257/E29.345
2017/0345824 A1* 11/2017 Ma ...................... H10B 12/0335
2018/0076205 A1* 3/2018 Li ........................ H10B 12/053
2022/0406791 A1* 12/2022 Kim ..................... H10B 12/485
2023/0225113 A1* 7/2023 Na ...................... H10B 12/0335 257/306

(Continued)

FOREIGN PATENT DOCUMENTS

CN 112530947 A 3/2021
CN 111640752 B 12/2021

(Continued)

*Primary Examiner* — Didarul A Mazumder

(74) *Attorney, Agent, or Firm* — Winston Hsu

(57) ABSTRACT

A semiconductor device includes a substrate, plugs and a storage node pad structure. The plugs are disposed on the substrate and include first plugs with a conductive material and second plugs with an insulating material. The storage node pad structure is disposed on the plugs and includes first extension pads and at least one second extension pad. The first extension pads have a predetermined first length in a first direction and are separated from each other and arranged as an array along the first direction, being in physical contact with one of the first plugs. The at least one second extension pad has a length greater than the predetermined first length and is in physical contact with at least one of the plugs.

20 Claims, 17 Drawing Sheets

(56) References Cited

U.S. PATENT DOCUMENTS

| | | | | |
|---|---|---|---|---|
| 2023/0298999 A1* | 9/2023 | Ahn | ....................... | H10B 12/09<br>257/213 |

FOREIGN PATENT DOCUMENTS

| | | | |
|---|---|---|---|
| CN | 114038850 | A | 2/2022 |
| CN | 111640754 | B | 3/2022 |
| JP | 2014-216409 | A | 11/2014 |

* cited by examiner

SEMICONDUCTOR DEVICE AND METHOD OF FORMING THE SAME

BACKGROUND OF THE INVENTION

1. Field of the Invention

The present invention generally relates to a semiconductor device and a method of forming the same, and more particularly, to a semiconductor device including an extension pad, and a method of forming the same.

2. Description of the Prior Art

With the trend of miniaturization of various electronic products, the design of semiconductor devices must also meet the requirements of high integration and high density. Under the current mainstream of development trend, dynamic random access memories (DRAMs) having recessed gate structures have gradually replaced the DRAMs having only planar gate structures due to longer carrier channel length for the same semiconductor substrate so as to reduce current leakage of capacitor structures. In general, a DRAM cell with a recessed gate structure includes a transistor component and a charge storage device to receive voltage signals from bit lines and word lines. However, due to the limitations of current processing technologies, there are still many defects in currently available DRAM cells with recessed gate structures, which need to be further improved to effectively improve the performance and reliability of related memory devices.

SUMMARY OF THE INVENTION

An object of the present invention is to provide a semiconductor device and a method of forming the same, in which a supporting structure formed between a cell region and a periphery region, has a localized larger thickness, thereby providing improved structural support for a capacitor structure.

In order to achieve the above object, an embodiment of the present invention provides a semiconductor device, which includes a substrate, a plurality of plugs and a storage node pad structure. The plurality of plugs are disposed on the substrate, and include a plurality of first plugs with a conductive material and a plurality of second plugs with an insulating material. The storage node pad structure is disposed on the plurality of plugs, and includes a plurality of first extension pads and at least one second extension pad. The plurality of first extension pads have a predetermined first length in a first direction, and are separated from each other and arranged as an array along the first direction, and one of the plurality of first extension pads is in physical contact with one of the plurality of first plugs. The at least one second extension pad has a length greater than the predetermined first length and is in physical contact with at least one of the plurality of plugs.

In order to achieve the above object, another embodiment of the present invention provides a semiconductor device, which includes a substrate, a plurality of plugs and a storage node pad structure. The plurality of plugs are disposed on the substrate, and include a plurality of first plugs with a conductive material and a plurality of second plugs with an insulating material. The storage node pad structure is disposed on the plurality of plugs, and includes a plurality of first extension pads, at least one second extension pad and an extension margin. The plurality of first extension pads have a predetermined first length in a first direction, wherein the plurality of first extension pads are separated from each other and arranged as an array along the first direction, and one of the plurality of first extension pads is in physical contact with one of the plurality of first plugs. The at least one second extension pad has a length greater than the predetermined first length. The extension margin is disposed around the outside of all the plurality of first extension pads and the at least one second extension pad, wherein the extension margin comprises at least one first border extending along a second direction and at least one second border extending along a third direction, and the extension margin is in physical contact with at least one of the plurality of plugs.

In order to achieve the above object, a further embodiment of the present invention provides a method of forming a semiconductor device, which includes the following steps. A substrate is provided. A plurality of plugs are formed on the substrate, wherein the plurality of plugs include a plurality of first plugs with a conductive material and a plurality of second plugs with an insulating material. A storage node pad structure is formed on the plurality of plugs, wherein the storage node pad structure include a plurality of first extension pads and a second extension pad. The plurality of first extension pads have a predetermined first length in a first direction, wherein the plurality of first extension pads are separated from each other and arranged as an array along the first direction, and one of the plurality of first extension pads is in physical contact with one of the plurality of first plugs. The second extension pad has a length greater than the predetermined first length and is in physical contact with at least one of the plurality of plugs.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 1 to FIG. 3 are schematic diagrams illustrating a semiconductor device according to a first embodiment of the present invention, wherein:

FIG. 1 is a top view of a semiconductor device;

FIG. 2 is a cross-sectional view of the semiconductor device taken along line A-A' shown in FIG. 1; and FIG. 3 is a cross-sectional view of the semiconductor device taken along line B-B' shown in FIG. 1.

FIG. 5 to FIG. 7 are schematic diagrams illustrating a semiconductor device according to a second embodiment of the present invention, wherein:

FIG. 5 is a top view of a semiconductor device;

FIG. 6 is a cross-sectional view of the semiconductor device taken along line C-C' shown in FIG. 5; and FIG. 7 is a cross-sectional view of the semiconductor device taken along line D-D' shown in FIG. 5.

FIG. 8 to FIG. 10 are schematic diagrams illustrating a semiconductor device according to a third embodiment of the present invention, wherein:

FIG. 8 is a top view of a semiconductor device;

FIG. 9 is a cross-sectional view of the semiconductor device taken along line E-E" shown in FIG. 8; and FIG. 10 is a cross-sectional view of the semiconductor device taken along line F-F' shown in FIG. 8.

FIG. 11 to FIG. 13 are schematic diagrams illustrating a semiconductor device according to a fourth embodiment of the present invention, wherein:

FIG. 11 is a top view of a semiconductor device;

FIG. 12 is a cross-sectional view of the semiconductor device taken along line G-G' shown in FIG. 11; and FIG. 13 is a cross-sectional view of the semiconductor device taken along line H-H' shown in FIG. 11.

FIG. 14 to FIG. 15 are schematic diagrams illustrating a semiconductor device according to a fifth embodiment of the present invention, wherein:

FIG. 14 is a top view of a semiconductor device; and

FIG. 15 is a cross-sectional view of the semiconductor device taken along line I-I' shown in FIG. 14.

FIG. 16 to FIG. 17 are schematic diagrams illustrating a semiconductor device according to a sixth embodiment of the present invention, wherein:

FIG. 16 is a top view of a semiconductor device; and

FIG. 17 is a cross-sectional view of the semiconductor device taken along line J-J' shown in FIG. 16.

DETAILED DESCRIPTION

For better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
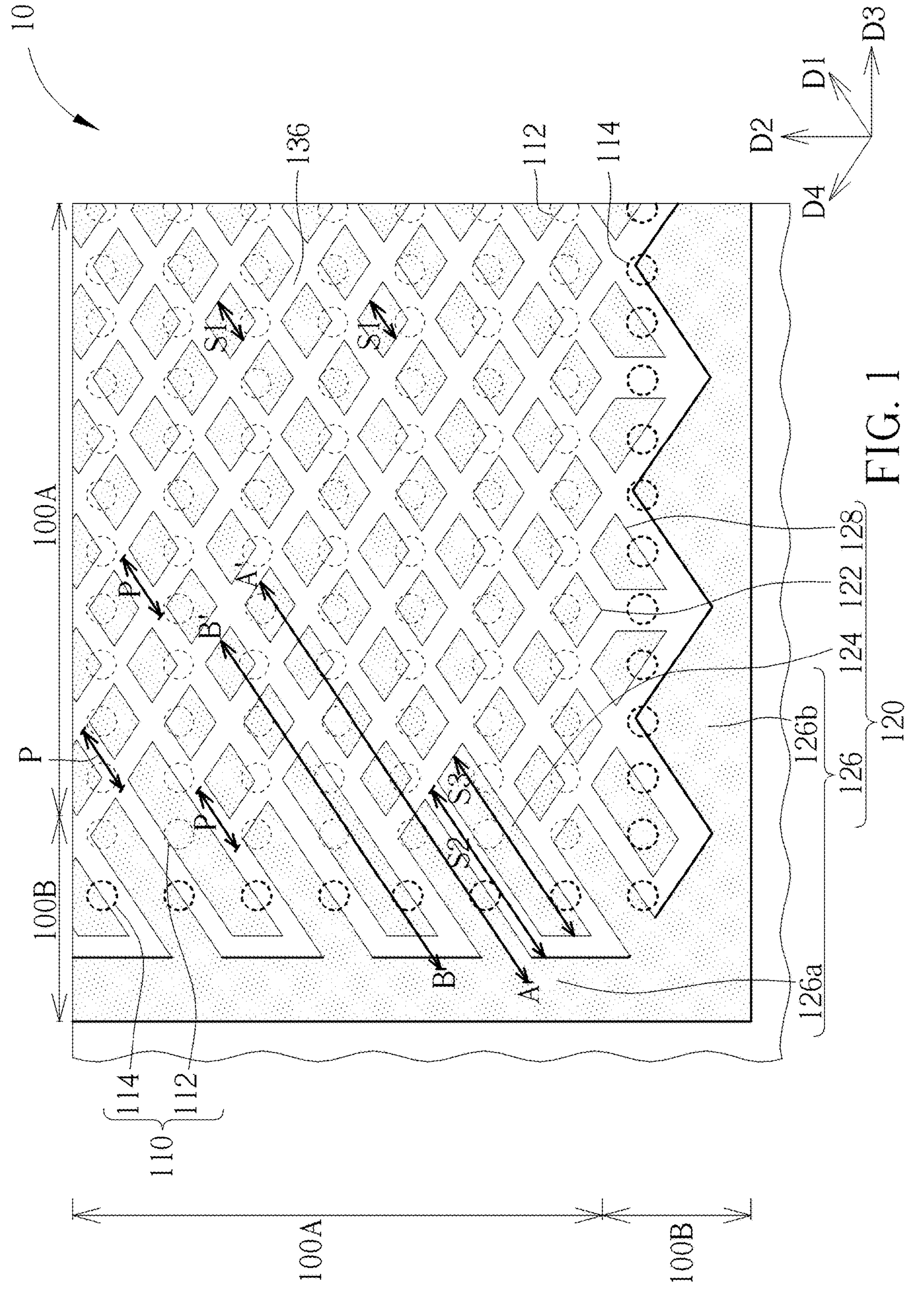
Figure 2:
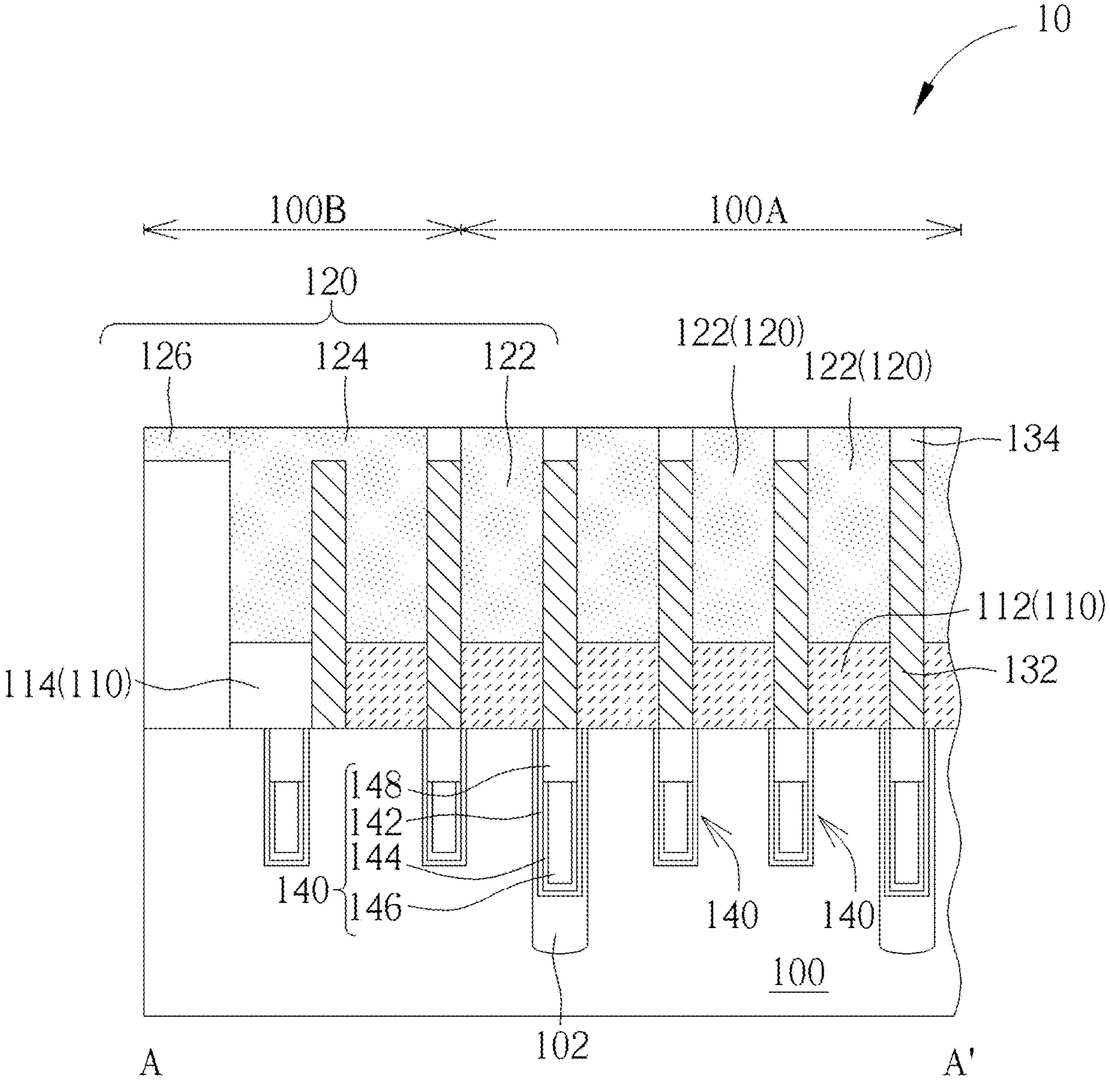
Figure 3:
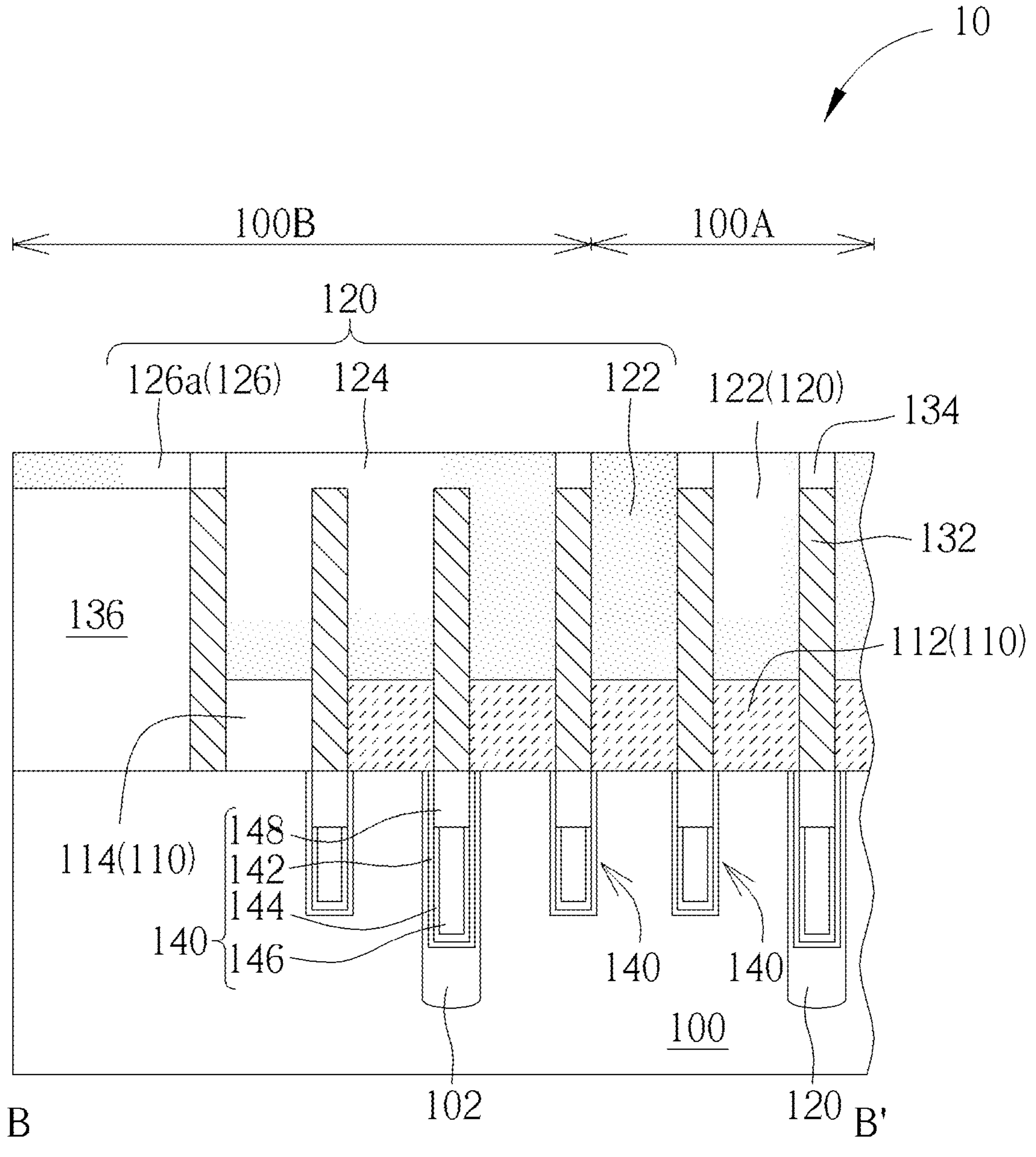

Please refer to FIG. 1 to FIG. 3, which are schematic diagrams illustrating a semiconductor device 10 according to a first embodiment of the present invention. The semiconductor device 10 includes a substrate 100, a plurality of plugs 110 and a storage node (SN) pad structure 120. The substrate 100, for example, may be a silicon substrate, a silicon-containing substrate, e.g., SiC or SiGe, a silicon-on-insulator (SOI) substrate, or a substrate formed of any other suitable material, but it is not limited thereto. The plugs 110 are disposed on the substrate 100 and include a plurality of first plugs 112 including a conductive material and a plurality of second plugs 114 including an insulating material. In one embodiment, the conductive material includes an epitaxial material such as silicon (Si), silicon phosphorus (SiP), silicon germanium (SiGe) or germanium (Ge), a low-resistance metal material such as aluminum (Al), titanium (Ti), copper (Cu) or tungsten (W), or any other suitable metal silicide material. On the other hand, the insulating material includes, for example but is not limited to, silicon oxide or silicon oxynitride. The storage node pad structure 120 is disposed on the plugs 110 and includes a plurality of first extension pads 122 and a plurality of second extension pads 124. As shown in FIG. 1, the first extension pads 122 are separated from each other and arranged as an array along a first direction D1, and each of the first extension pads 122 is in physical contact with one of the first plugs 112. The first extension pads 122 respectively have a predetermined first length S1 in the first direction D1, while each of the second extension pads 124 has a length greater than the predetermined first length S1 in the first direction D1. For example, it is shown as, but not limited to, a length S2 or a length S3 in FIG. 1. It is to be noted that at least one of the second extension pads 124 is in physical contact with one of the at least one plugs 110. For example, at least one of the second extension pads 124 is in physical contact with the first plug 112 with a conductive material and/or the second plug 114 with an insulating material. In this way, the second extension pad 124, the first plug 112 and/or the second plug 114 jointly form a dummy storage node plug, so as to improve possible structural defects of the semiconductor device 10 due to continuous increase of the memory cell density.

In one embodiment, the first plugs 112 are sequentially disposed in a second direction D2, e.g., Y direction, and a third direction D3 perpendicular to the second direction D2. The first plugs 112 are arranged as an array different from the aforementioned array, i.e., the array of the first extension pads 122. On the other hand, a plurality of second plugs 114 are sequentially arranged in the second direction D2 and the third direction D3, respectively, and surround the outside of all the first plugs 112, as shown in FIG. 1. The second plugs 114 are in physical contact with the second extension pads 124 to form a plurality of dummy storage node plugs disposed outside the first plugs 112 in a surrounding manner.

In detail, the storage node pad structure 120 further includes an extension margin 126 and a plurality of third extension pads 128. The extension margin 126 includes at least a first border 126*a* extending along the second direction D2 and at least a second border 126*b* extending along the third direction D3. The second extension pads 124 are disposed between the first border 126*a* and the first extension pads 122. Meanwhile, the third extension pads 128 are disposed between the second border 126*b* and the first extension pads 122. The extension margin 126 as a whole presents a rectangular frame shape or any other suitable shape and surrounds the outside of all the first extension pads 122, the second extension pads 124 and the third extension pads 128. The effect of protecting the first extension pads 122, the second extension pads 124 or the third extension pads 128 can thus be achieved. In an embodiment, the storage node pad structure 120 includes, for example but is not limited to, a metal material with low resistance, e.g., aluminum, titanium, copper or tungsten. The third extension pads 128 extend along the first direction D1 or along a fourth direction D4, which crosses but is not perpendicular to the first direction D1. The extension pads are arranged as an array with a constant pitch P existing between immediately adjacent two first extension pads 122, immediately adjacent first extension pad 122 and second extension pad 124 and immediately adjacent first extension pad 122 and third extension pad 128 in the first direction D1, but it is not limited thereto. It is to be noted that the second extension pads 124 may optionally contact the extension margin 126. For example, some of the second extension pads 124 adjacent to the first border 126*a* are in physical contact with the first border 126*a*, while the others are not in physical contact with the first border 126*a*, as shown in FIG. 1. Furthermore, the second extension pads 124 in contact with and not in contact with the first border 126*a* are arranged alternately at an interval in the second direction D2. The length S3 of each of the second extension pads 124 not in contact with the first border 126*a* in the first direction D1 is, for example, greater than the length S2 of the second extension pads 124 in contact with the first border 126*a* in the first direction D1, but it is not limited thereto. Meanwhile, none of the third extension pads 128 is in contact with the second border 126*b*.

As shown in FIG. 2 and FIG. 3, a plurality of shallow trench isolations (STIs) 102 are disposed in the substrate 100 to define a plurality of active areas (not shown) in the substrate 100, and the plugs 110 including the first plugs 112 and the second plugs 114 are in physical contact with the active areas and the first extension pads 122 disposed above the plugs 110, respectively. Adjacent plugs 110 and adjacent first extension pads 122 or second extension pads 124 are isolated from each other by way of a storage node contact isolation (SCISO) 132 and an insulating layer 134 disposed on the substrate 100. An insulating layer 136 is disposed under the extension margin 126. The top surfaces of the insulating layer 136 and the insulating layer 134 are flush with each other. In an embodiment, the storage node contact isolation 132 includes, for example, an insulating material different from the second plugs 114 or the insulating layer 136. The insulating material may be, for example but not limited to, silicon nitride and silicon carbonitride. In this way, each of the first plugs 112 may be electrically connected to the substrate 100 to receive and transmit voltage signals from the substrate 100, e.g., from transistor components disposed in the substrate 100. On the other hand, one of the first plugs 112 and one of the second plugs 114 as shown in FIG. 2, which are in physical contact with the same second extension pad 124, e.g., the one in contact with the extension margin 126, and/or two of the first plugs 112 and one of the second plugs 114 as shown in FIG. 3, which are simultaneously in physical contact with the same second extension pad 124, e.g., the one not in contact with the extension margin 126, are not electrically connected to the substrate 100. Instead, they jointly form the dummy storage node plug.

As shown in FIG. 2 and FIG. 3, the semiconductor device 10 further includes a plurality of buried gate structures 140 disposed in the substrate 100. The buried gate structures 140 are located in a storage region 100A of the substrate 100, where component integration is relatively high. Each of the gate structures 140 includes a dielectric layer 142, a gate dielectric layer 144, a gate 146, and a capping layer 148 stacked in sequence, wherein a surface of the capping layer 148 may be aligned with a top surface of the substrate 100, so that each gate structure 140 may be used as a buried word line (BWL) of the semiconductor device 10. In addition, the substrate 100 further includes a peripheral region 100B with relatively low component integration, which is, for example, arranged on at least one side of the storage region 100A. Preferably, from the top view as shown in FIG. 1, the peripheral region 100B is, for example, arranged around the outside of the storage region 100A, but it is not limited thereto. Therefore, all the first extension pads 122 and the first plugs 112 are, for example, disposed in the storage region 100A; the whole extension margin 126 is disposed in the peripheral region 100B; and the second extension pads 124 and the second plugs 114 are disposed in the peripheral region 100B and a boundary area between the peripheral region 100B and the storage region 100A.

Figure 4:
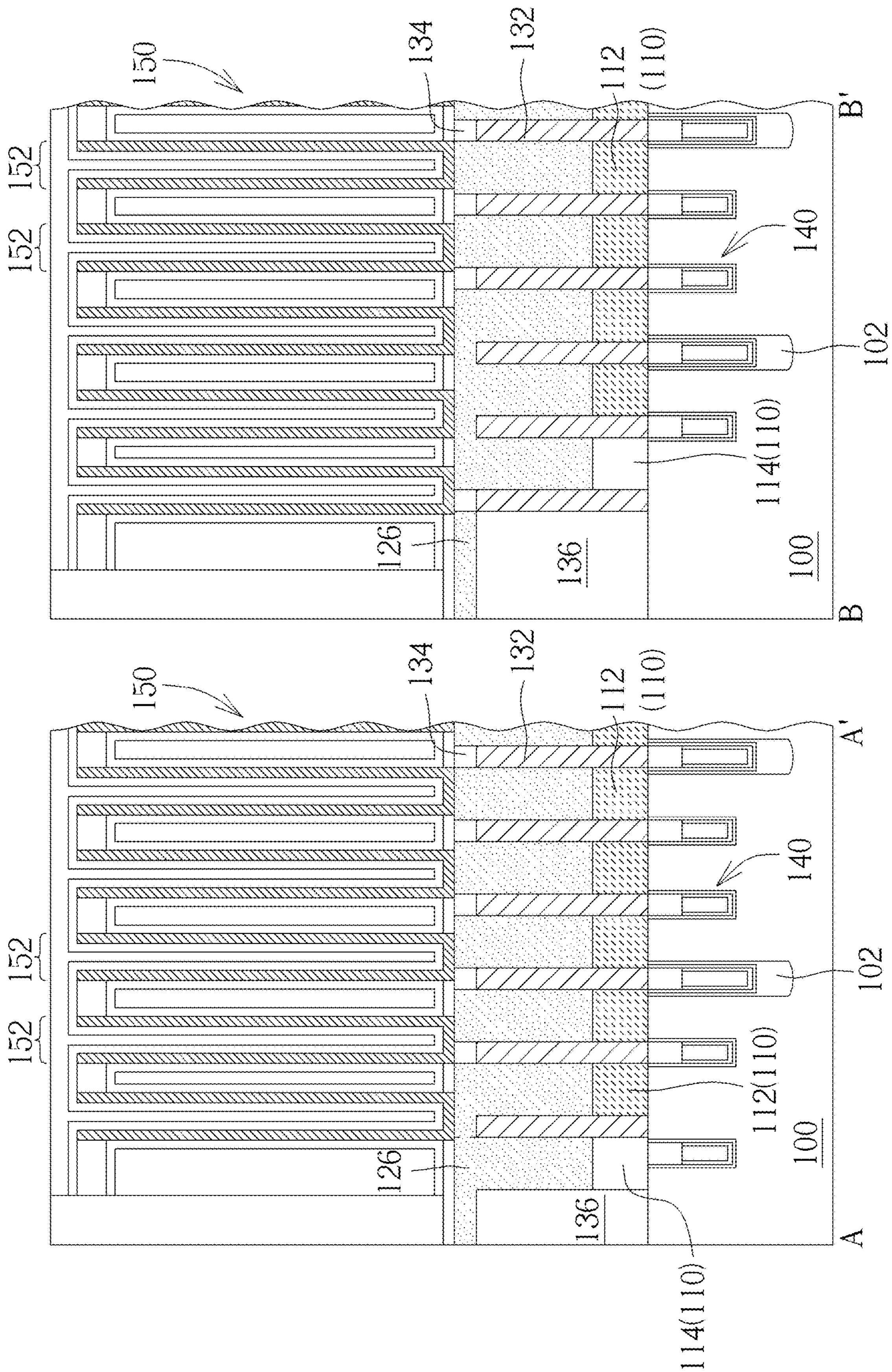
FIG. 4 is a cross-sectional view of a semiconductor device according to a preferred embodiment of the present invention.

In this configuration of the semiconductor device 10 in the first embodiment of the present invention, a plurality of dummy storage node plugs are formed in the borders by means of the second plugs 114 and the second extension pads 124 dispose above the second plugs 114. Moreover, since the same second extension pad 124 may be in physical contact with one of the first plugs 112 and/or one of the second plugs 114 at the same time, and may further optionally contact the first border 126*a*, each dummy storage node plug may have a variable cross-sectional structure. In addition, although not specifically shown in the drawings, those skilled in the art can easily understand that the second plug(s) 114 and the third extension pad(s) 128 in this embodiment may also jointly form a dummy storage node plug with a variable cross-sectional structure. In this way, in a process of forming the semiconductor device 10, the second plugs 114 can be formed during formation of the first plugs 112 other than using an additional process, and meanwhile the first extension pads 122 and the second extension pads 124 are synchronously formed. The process of forming the semiconductor device 10 may maintain the same overall luminous flux in areas with different component integration levels during the photolithography process, thereby improving the production yield of the semiconductor device 10. The semiconductor device 10 in this embodiment has improved structure and performance. A capacitor structure 150 as shown in FIG. 4 may be formed in the storage region 100A in the subsequent process. The capacitor structure 150 includes a plurality of vertical capacitors electrically connected to the first extension pads 122, respectively, to form a dynamic random access memory (DRAM) device and achieve further improved operational performance. In the semiconductor device 10, more than one vertical capacitor 152 may be optionally disposed on one of the second extension pads 124, which is in contact with the first border 126*a*, and/or more than two vertical capacitors 152 may be optionally disposed on one of the second extension pads 124, which is not in contact with the first border 126*a*. However, it is not limited thereto.

In order to make the semiconductor device 10 of the present invention easily understood by those skilled in the art, a method of forming the semiconductor device 10 of the present invention will be further described hereinafter.

The method of forming the semiconductor device 10 includes, but is not limited to, the following steps. First, a substrate 100 is provided, and shallow trench isolation 102 is formed in the substrate 100. In one embodiment, the shallow trench isolation 102 is formed by, for example, performing an etching process to form a plurality of trenches (not shown) in the substrate 100; then filling an insulating material, e.g., silicon oxide or silicon oxynitride, in the trenches; and performing a planarization process, thereby producing the required shallow trench isolation 102, and an active area can be simultaneously defined, but it is not limited thereto. Next, a gate structure 140 is formed in the substrate 100 and disposed in the storage region 100A. In one embodiment, the process of forming the gate structure 140 includes, but is not limited to, the following steps. A plurality of trenches (not shown) extending in parallel with each other are formed in the substrate 100, and then a dielectric layer 142 covering the entire surface of each trench, a gate dielectric layer 144 covering the surface of the lower half of each trench, a gate electrode 146 filling the lower half of each trench and a capping layer 148 filling the upper half of each trench are formed in each trench. Accordingly, the gate structure 140 is formed in the substrate 100 as a buried word line of the semiconductor device 10.

Then, a plurality of bit lines (BL, not shown) and plugs 110 are formed on the substrate 100, wherein the first plugs 112 are all formed in the storage region 100A, and the second plugs 114 are formed in the peripheral region 100B and a boundary area between the peripheral region 100B and the storage region 100A. Although the bit lines in this embodiment are not specifically depicted in the drawings, those skilled in the art can easily understand that the bit lines are parallel to each other and extend in a direction perpendicular to the buried word lines, e.g., the gate structures 140, electrically connected to the substrate 100 through corresponding bit line contacts (BLCs) formed thereunder, and electrically insulated from the gate electrodes 140 in the substrate 100 by way of an insulating layer (not shown, for example, a structure containing silicon oxide-silicon nitride-silicon oxide) covering a top surface of the substrate 100.

An insulating material layer (not shown) covering the entire substrate 100 is further formed. Then storage node contact isolation 132 and plugs 110 are formed in the insulating material layer. In an embodiment, the insulating material layer includes insulating materials such as silicon oxide or silicon oxynitride, and the process of forming the plugs 110 includes, but is not limited to, the following steps. A plurality of openings (not shown) are formed in the insulating material layer with a mask layer (not shown), including a plurality of first openings (not shown) that expose the surface of the substrate 100 and are located in the storage region 100A, and a plurality of second openings (not shown) that do not expose the surface of the substrate 100 due to presence of the remaining part of the insulating material layer and are located in the peripheral region 100B. Then, an epitaxial process is performed to form an epitaxial material, e.g., silicon, silicon phosphorus, silicon germanium or germanium, in each of the first openings, and form the first plugs 112 as shown in FIG. 1 to FIG. 3. Meanwhile, the insulating material layer remaining in the second openings forms the second plugs 114 as shown in FIG. 1 to FIG. 3.

Subsequently, the mask layer is removed, and a metal silicide process and a deposition process are sequentially performed on the substrate 100 to simultaneously form a metal silicide layer on the first plugs 112. Furthermore, a conductive material layer (not shown) is deposited on the plugs 110, which include the first plugs 112 and the second plugs 114. The conductive material layer fills the first openings and the second openings, and further covers the storage node contact isolation 132 and the top surface of the remaining insulating material layer. Finally, a self-aligned multi-patterning process is performed to pattern the conductive material layer to form the storage node pad structure 120 as shown in FIG. 1 to FIG. 3. The storage node pad structure 120 includes first extension pads 122, second extension pads 124, an extension margin 126 and third extension pads 128. The insulating material layer is filled in the gaps among the first extension pads 122, the second extension pads 124, the extension margin 126 and the third extension pads 128. On the other hand, after the storage node pad structure 120 is formed, the remaining insulating material layer synchronously forms the insulating layer 136 as shown in FIG. 2 and FIG. 3 under the extension margin 126 and has a top surface flush with the storage node contact isolation 132.

By way of the foregoing, the formation of the semiconductor device 10 is completed. According to the above method, the first plugs 112 are formed in the storage region 100A, and the second plugs 114 are formed in the peripheral region 100B or the boundary area. When the first extension pads 122 are formed on the first plugs 112, the second extension pads 124 or the third extension pads 128 may be simultaneously formed on the second plugs 114. In this way, when a photolithography process of the plugs 110 or the storage node pad structure 120 is carried out, not only may an additional process for forming the second plugs 114 be omitted, but also may luminous flux be kept constant all over the regions with different component integration levels, so as to improve the yield of the process of forming the semiconductor device 10. Under this operation, the second plugs 114, the second extension pads 124 formed on the second plugs 114 and the third extension pads 128 may jointly form a plurality of dummy storage node plugs in the peripheral region 100B and the boundary area to ameliorate structural defects of the semiconductor device 10 caused by a continuously increasing memory cell density. Accordingly, the semiconductor device 10 can have improved structure and performance. In a subsequent process, a capacitor structure 150 as shown in FIG. 4 may further be formed on the semiconductor device 10 so as to produce a dynamic random access memory device and achieve further improved operational performance. In the semiconductor device 10, more than one vertical capacitor 152 may be optionally disposed on one of the second extension pads 124 in contact with the first border 126*a*, and/or more than two vertical capacitors 152 may be optionally disposed on one of the second extension pad 124, which is not in contact with the first border 126*a*, but it is not limited to thereto.

It can be easily understood by those skilled in the art that a semiconductor device and a method of forming the same according to the present invention may have alternative forms without being limited to the foregoing on the premise of meeting the actual product requirements. Other embodiments or variations of the semiconductor device and the method of forming the same according to the present invention will be further described hereinafter. For simplification, the following descriptions are mainly focused on differences between embodiments, and the similarities will not be repeatedly described. Furthermore, the same components in different embodiments of the present invention are labeled with the same reference numerals in order to facilitate mutual comparison among embodiments.

Figure 5:
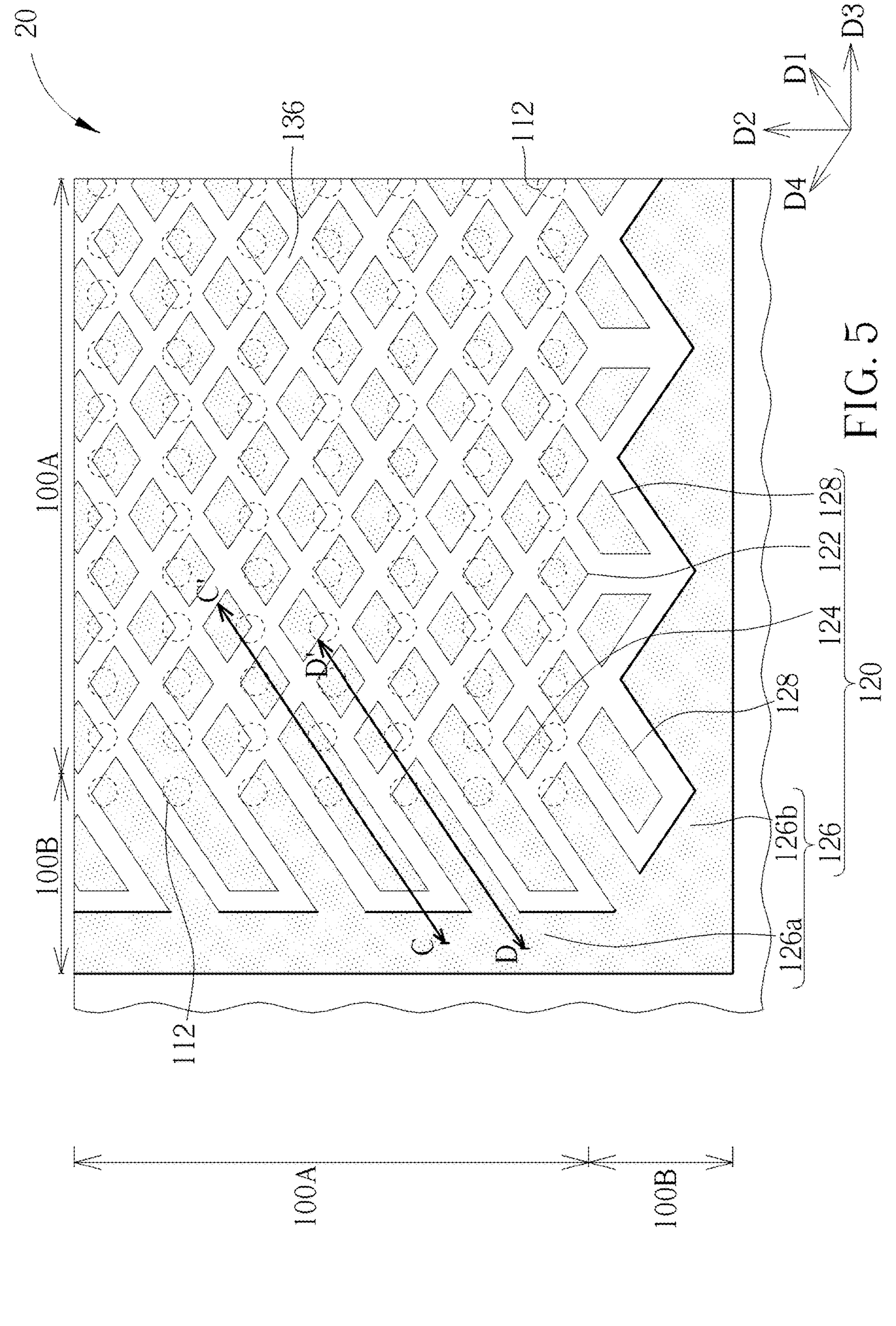
Figure 6:
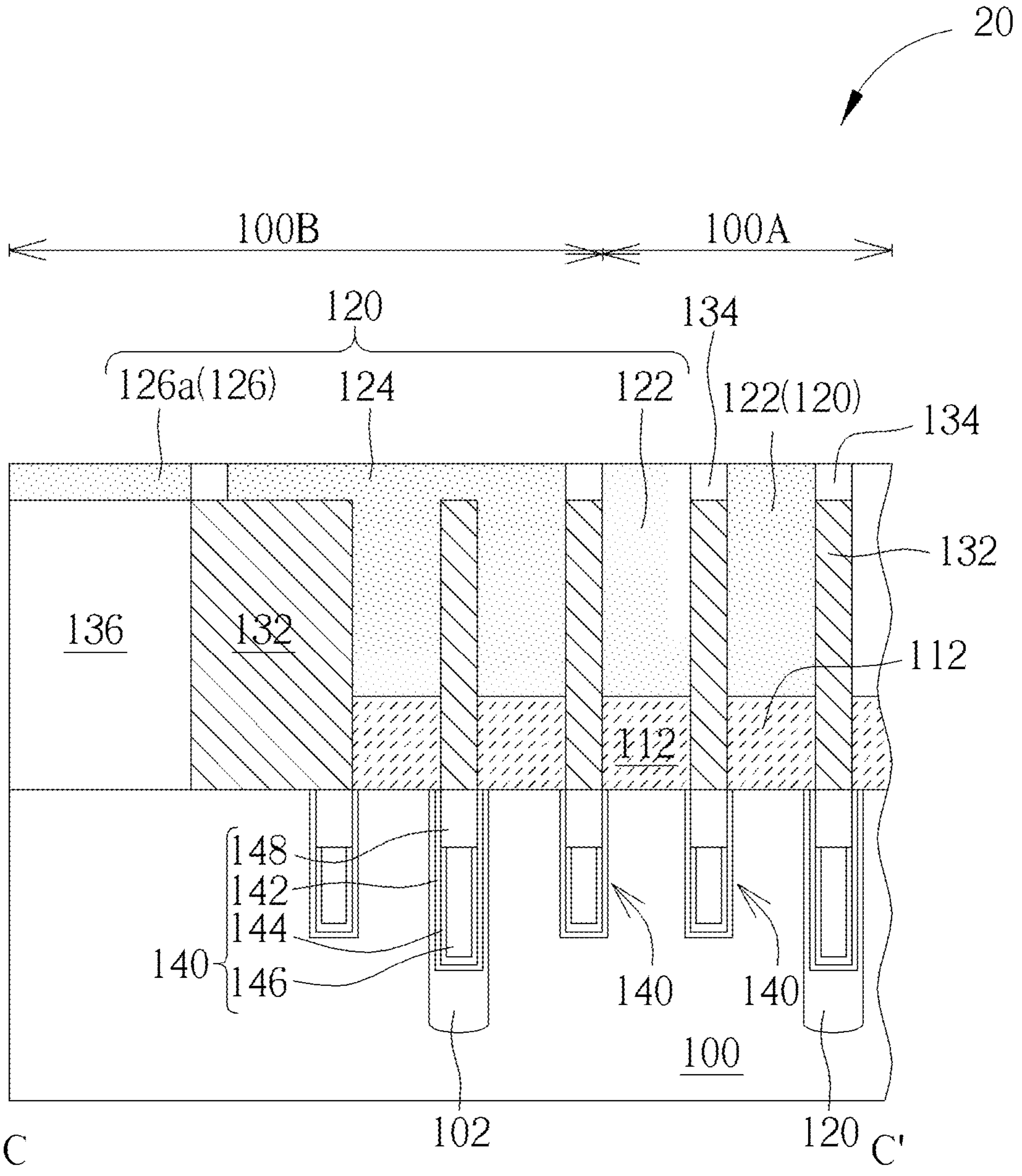
Figure 7:
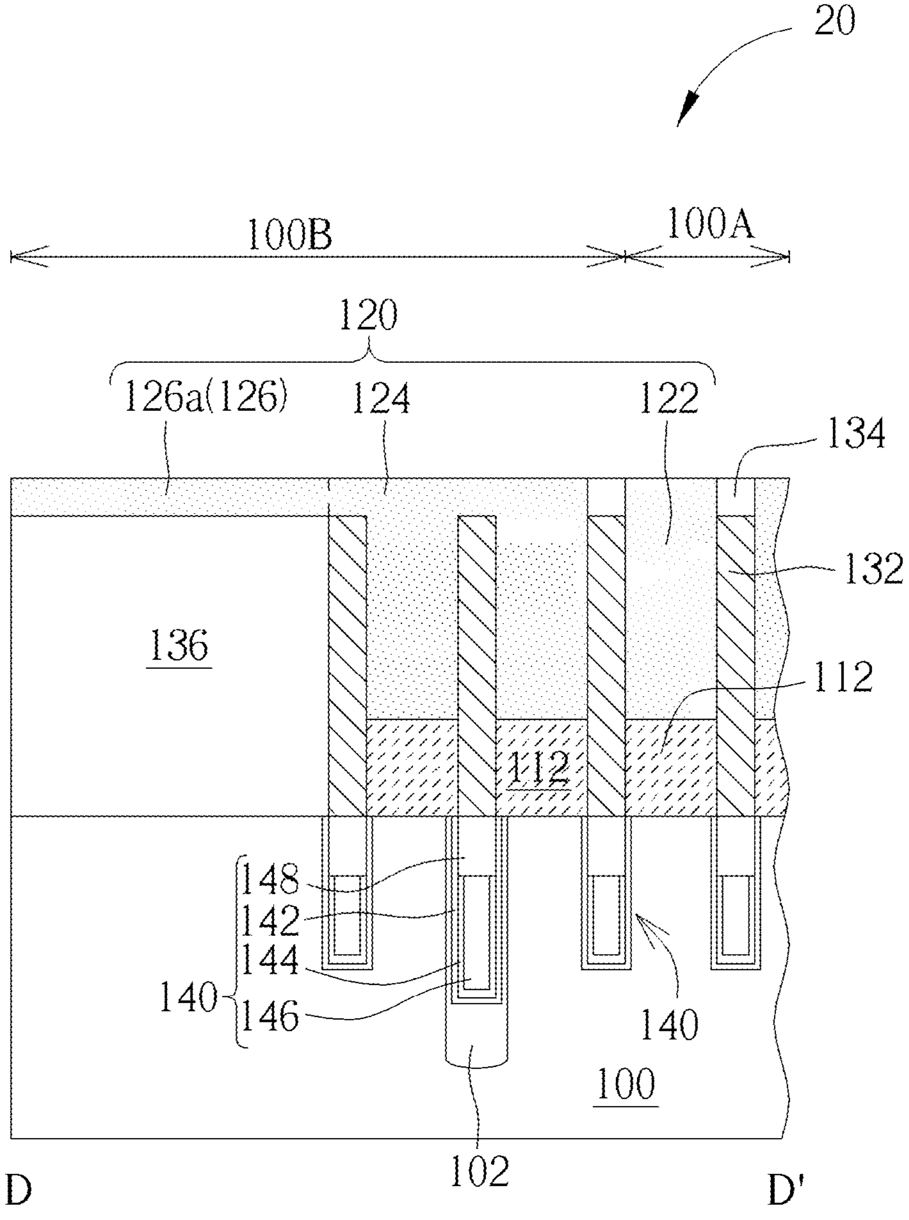

Refer to FIG. 5 to FIG. 7, which are schematic diagrams illustrating a semiconductor device 20 according to a second embodiment of the present invention. The semiconductor device 20 in this embodiment is basically similar to the semiconductor device 10 in the above-described embodiment, but mainly differs from the above-described embodiment in that the disposition of the second plugs 114 is omitted in the semiconductor device 20.

In detail, the plugs in this embodiment include only the first plugs 112 with a conductive material, and a first extension pad 122 or a second extension pad 124 is disposed above each of the first plugs 112. In other words, at least one second extension pad 124 that is not in contact with the extension margin 126 is in physical contact with two of the first plugs 112 with the conductive material at the same time, as shown in FIG. 6. Thus the two first plugs 112 supposed to be electrically connected to the substrate 100 are short-circuited due to contact with the same second extension pad 124 at the same time, thereby forming a dummy storage node plug. Alternatively, at least one second extension pad 124 that is in contact with the extension margin 126 is in physical contact with one of the first plugs 112 with the conductive material, as shown in FIG. 7. Thus the first plug 112 supposed to be electrically connected to the substrate 100 is short-circuited due to extra contact with the extension margin 126. The dummy storage node plug can still be formed.

In this configuration of the semiconductor device 20 in the second embodiment of the present invention, a plurality of dummy storage node plugs may be formed in the boundary area by means of the first plugs 112, the second extension pads 124 and the extension margin 126, and have different cross-sectional structures. Likewise, the structural defects of the semiconductor device 20 in this embodiment caused by a continuously increasing memory cell density can be ameliorated to have improved structure and performance. Meanwhile, the semiconductor device 20 may be formed with the capacitor structure 150 as shown in FIG. 4 in the storage region 100A in a subsequent process, and a plurality of vertical capacitors 152 of the capacitor structure 150 are made to be electrically connected to the first extension pads 122, respectively, thereby producing a dynamic random access memory device and achieving further improved operational performance. In the semiconductor device 20, more than one vertical capacitor 152 may be optionally disposed on one of the second extension pads 124 in contact with the first border 126*a*, and/or more than two vertical capacitors 152 may be optionally disposed on one of the second extension pad 124, which is not in contact with the first border 126*a*, but it is not limited to thereto.

Figure 8:
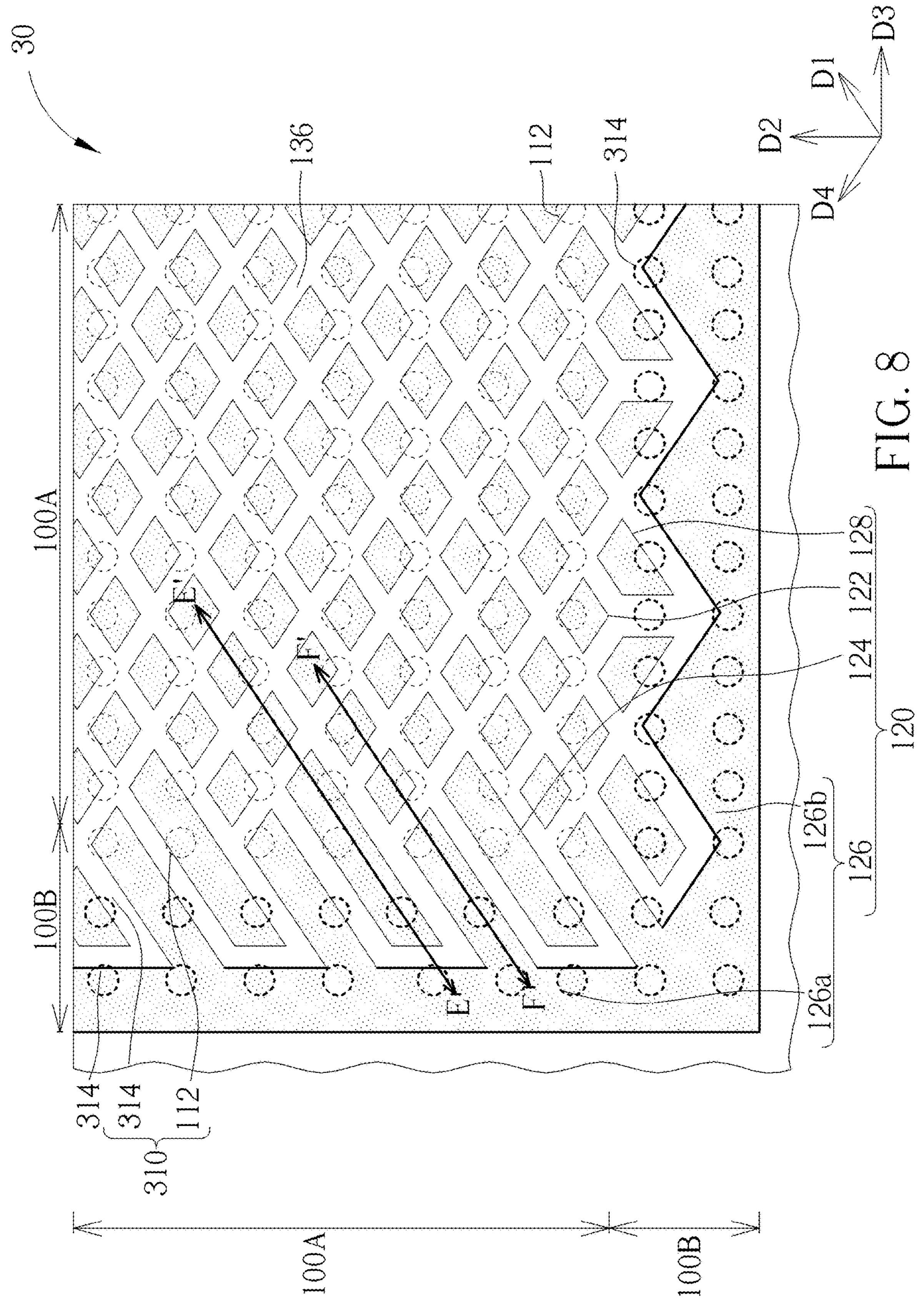
Figure 9:
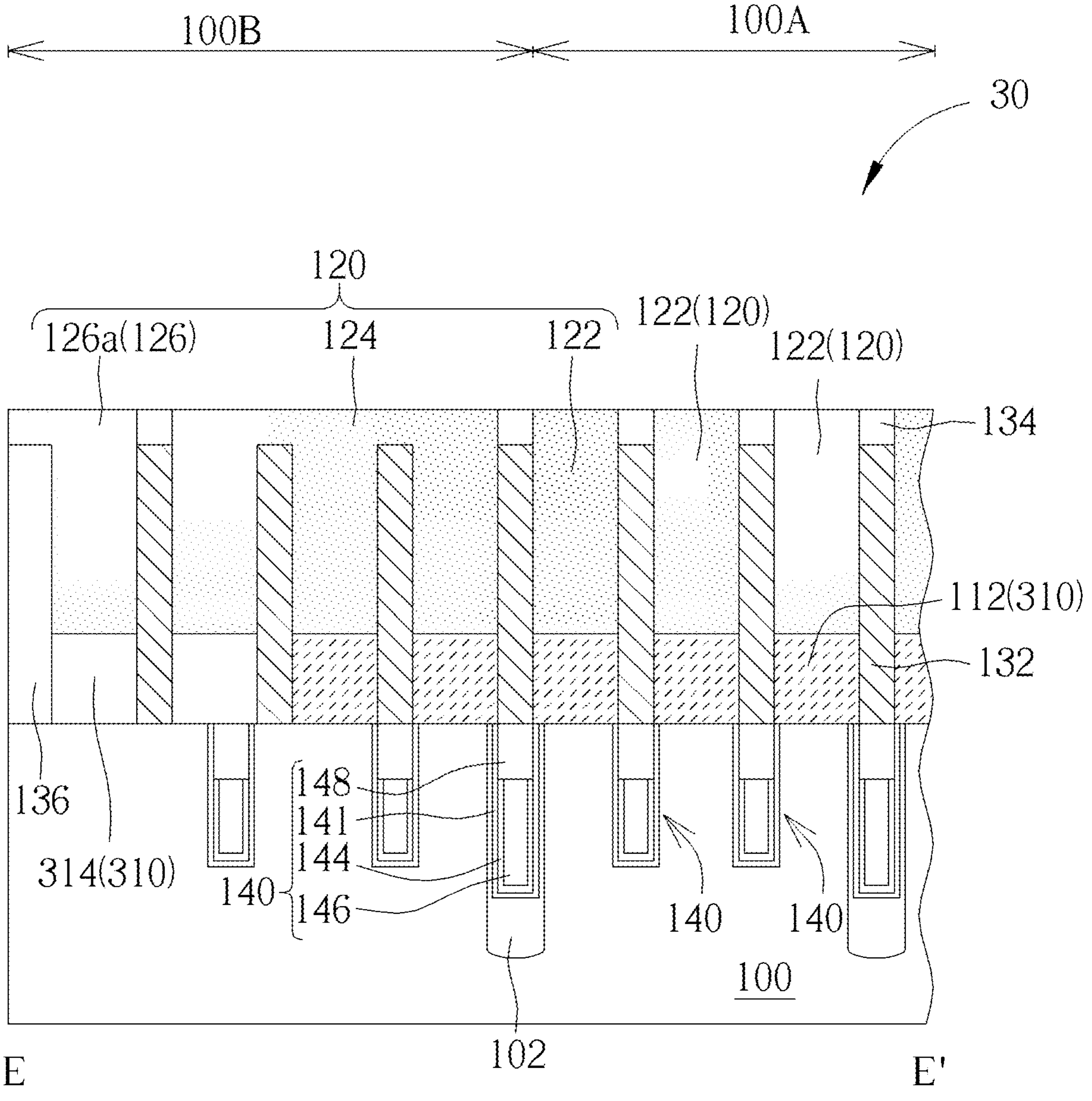
Figure 10:
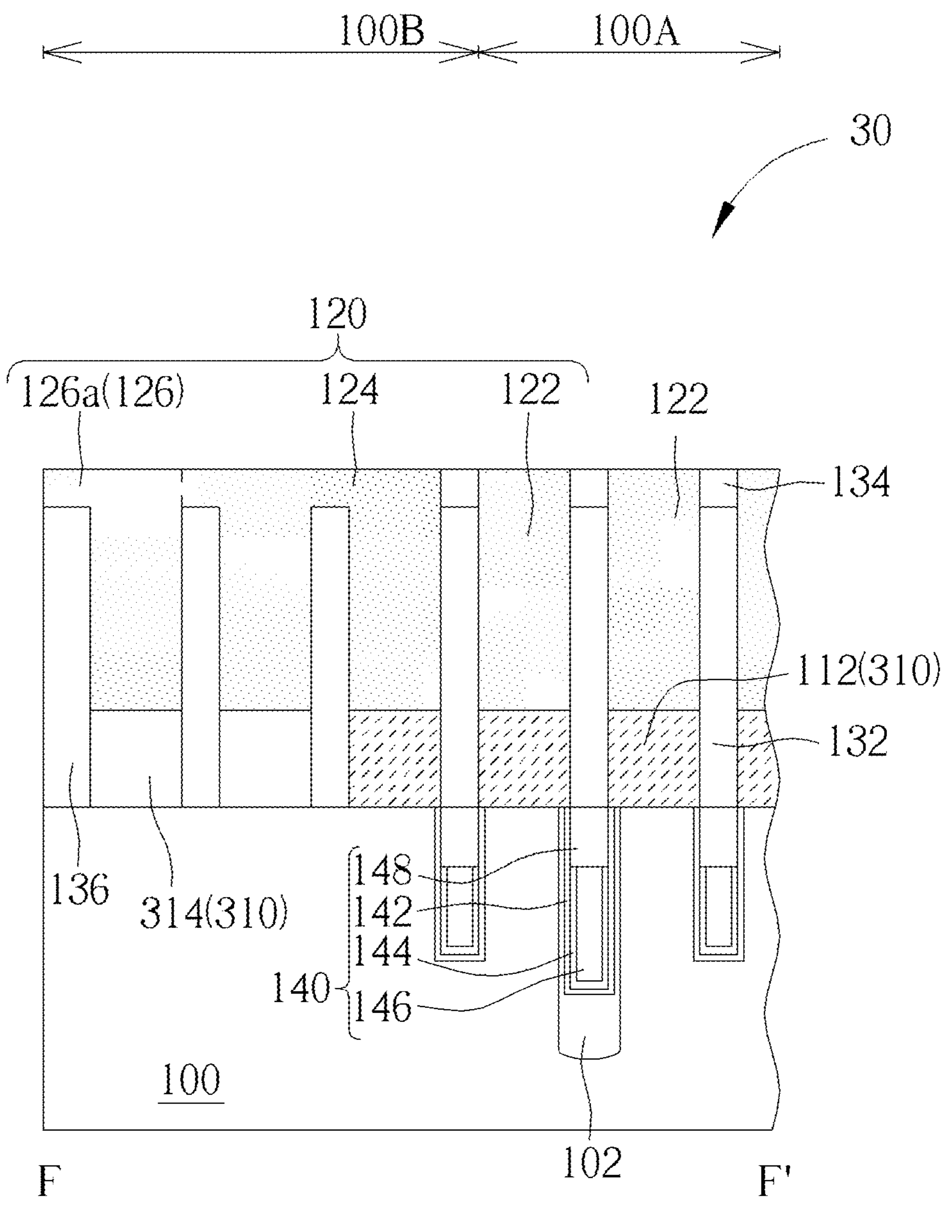

Refer to FIG. 8 to FIG. 10, which are schematic diagrams illustrating a semiconductor s device 30 according to a third embodiment of the present invention. The semiconductor device 30 in this embodiment is basically similar to the semiconductor device 10 in the above-described embodiment, but mainly differs from the above-described embodiment in that the semiconductor device 30 further includes a plurality of second plugs 314 with an insulating material and in physical contact with the extension margin 126.

In detail, plugs 310 in this embodiment include a plurality of first plugs 112 with a conductive material and a plurality of second plugs 314 with an insulating material. Each of the first plugs 112 is in physical contact with one of the first extension pads 122, and each of the second plugs 314 is in physical contact with the second extension pads 124, the third extension pads 128, or the first border 126*a* or second border 126 of the extension margin 126. As shown in FIG. 8, the plurality of second plugs 314 are disposed and arranged in sequence along the second direction D2 and the third direction D3, respectively, and are arranged in a plurality of columns or rows in the second direction D2 and the third direction D3, respectively. The plurality of second plugs 314 may, but are not limited to, overlap the first border 126*a* and the second border 126*b*.

It is to be noted that the first border 126*a* of the extension margin 126 overlaps and physically contacts at least one of the second plugs 314 in the direction perpendicular to the substrate 100. In addition, at least one of the second extension pads 124 physically contacts one of the second plugs 314 with the insulating material and two of the first plugs 112 with the conductive material at the same time, as shown in FIG. 9. Accordingly, the dummy storage node plugs can be formed in the peripheral region 100B or the boundary area. Alternatively, the first border 126*a* of the extension margin 126 overlaps and physically contacts at least one of the second plugs 314 in the direction perpendicular to the substrate 100, and also contacts at least one of the second extension pads 124, which has been in physical contact with one of the second plugs 314 and one of the first plugs 112, as shown in FIG. 10, so as to jointly form the dummy storage node plugs in the peripheral region 100B or the boundary area.

In this configuration of the semiconductor device 30 according to the third embodiment of the present invention, a plurality of dummy storage node plugs with different cross-sectional structures are formed by means of the first plugs 112, the second plugs 314, and the second extension pads 124 and the extension margin 126 disposed above the plugs. Although not specifically shown in the drawings, those skilled in the art can easily understand that one of the second plugs 314 and one of the third extension pads 128 in this embodiment may also jointly form a dummy storage node plug with a variable cross-sectional structure. Likewise, the structural defects of the semiconductor device 30 in this embodiment caused by a continuously increasing memory cell density can be ameliorated to have improved structure and performance. Meanwhile, the semiconductor device 30 may be formed with the capacitor structure 150 as shown in FIG. 4 in the storage region 100A in a subsequent process, and a plurality of vertical capacitors 152 of the capacitor structure 150 are made to be electrically connected to the first extension pads 122, respectively, thereby producing a dynamic random access memory device and achieving further improved operational performance. In the semiconductor device 30, more than one vertical capacitor 152 may be optionally disposed on one of the second extension pads 124 in contact with the first border 126*a*, and/or more than two vertical capacitors 152 may be optionally disposed on one of the second extension pad 124, which is not in contact with the first border 126*a*, but it is not limited to thereto.

Figure 11:
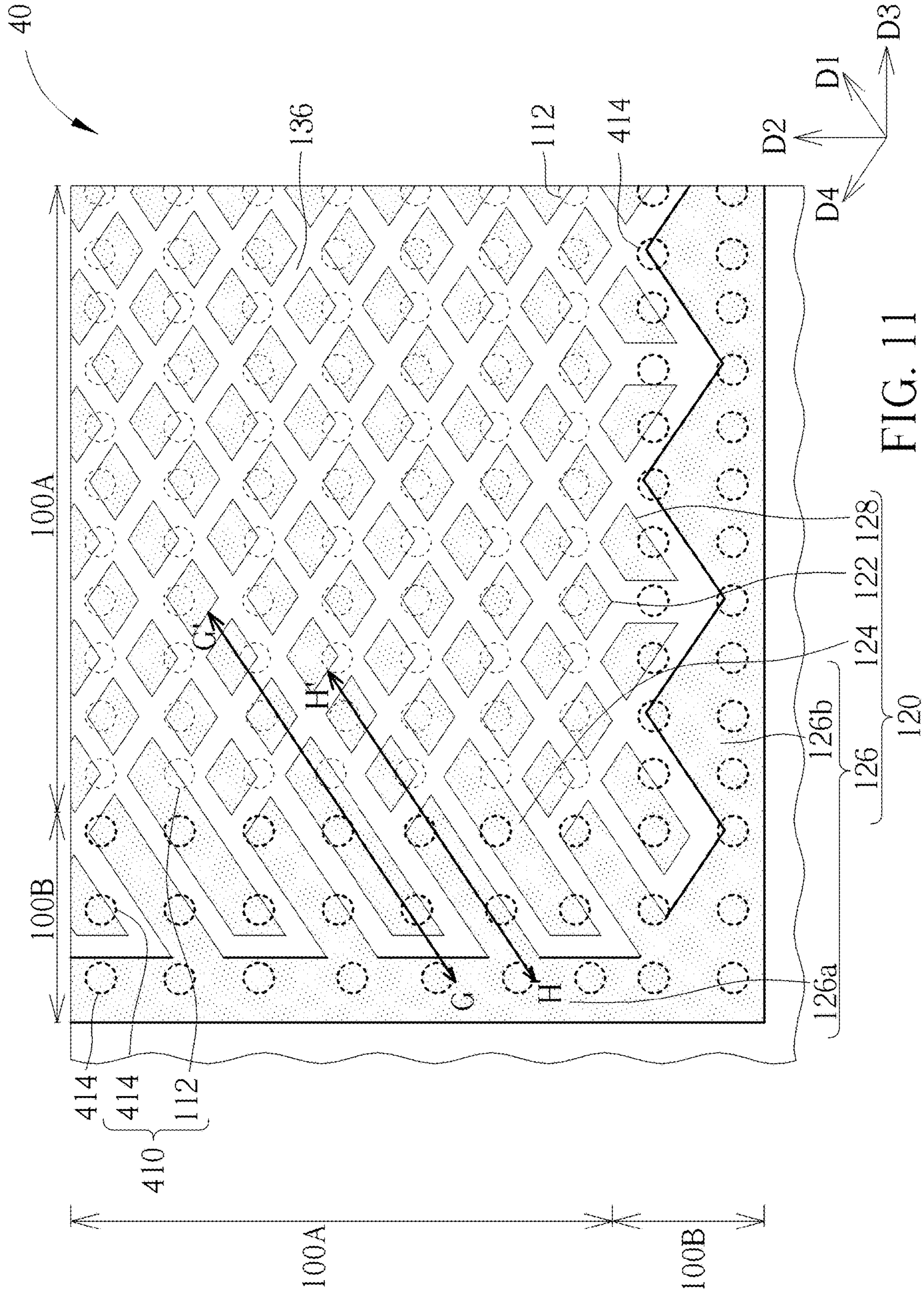
Figure 12:
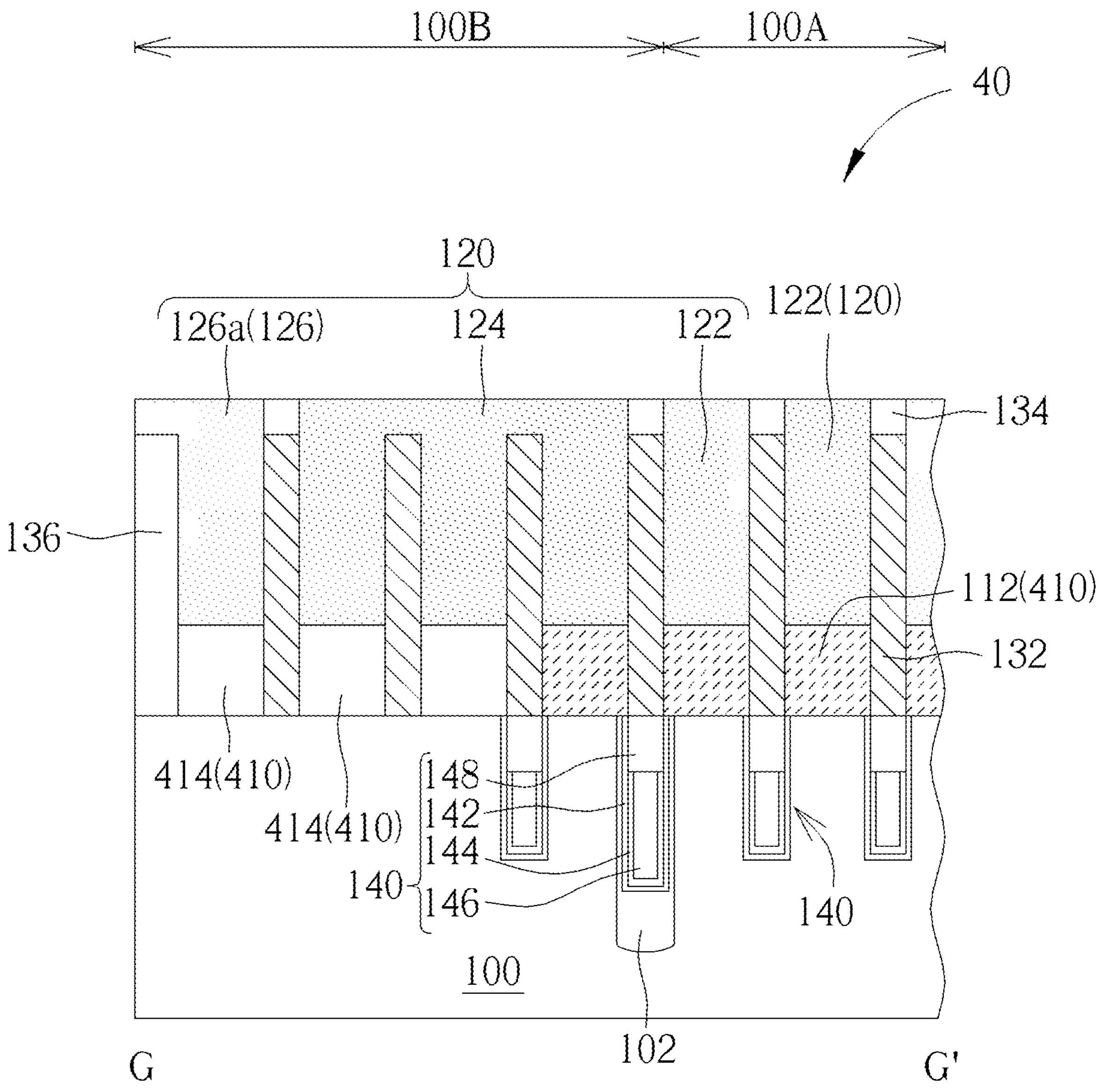
Figure 13:
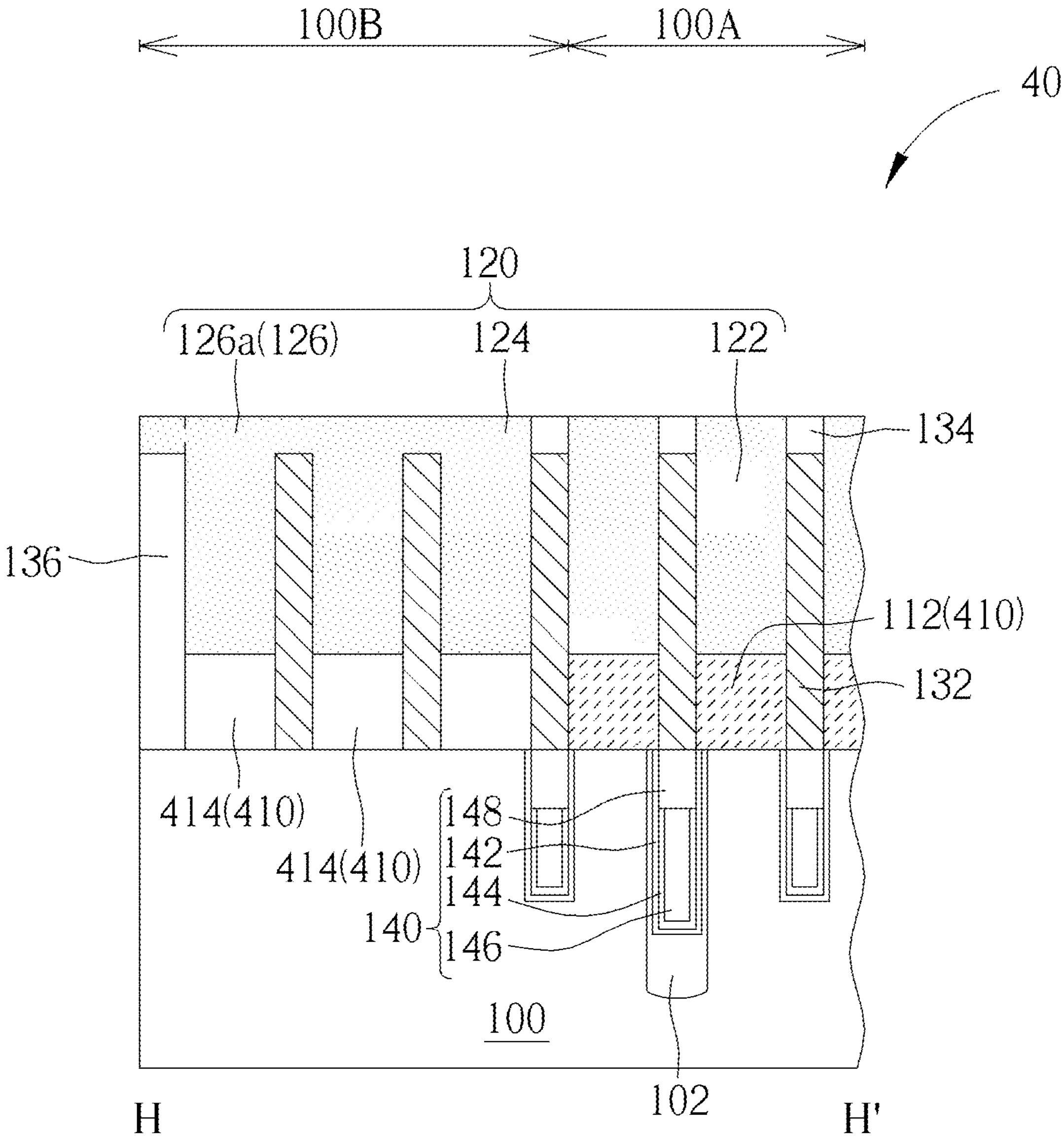

Refer to FIG. 11 to FIG. 13, which are schematic diagrams illustrating a semiconductor device 40 according to a fourth embodiment of the present invention. The semiconductor device 30 in this embodiment is basically similar to the semiconductor device 10 in the above-described embodiment, but mainly differs from the above-described embodiment in that plugs 410 of the semiconductor device 40 include a plurality of first plugs 112 with a conductive material, which are mainly disposed in the storage region 100A, and a plurality of second plugs 414 with an insulating material, which are only disposed in the peripheral region 100B.

As shown in FIG. 11, the plurality of second plugs 414 are disposed and arranged in sequence along the second direction D2 and the third direction D3, respectively, and are arranged in a plurality of columns or rows in the second direction D2 and the third direction D3, respectively. The number of the second plugs 414 arranged in columns is, for example, greater than the number of the second plugs 414 arranged in rows, but it is not limited thereto. The second extension pads 124, the third extension pads 128 or the extension margin 126 are arranged above the second plugs 414. The plugs 410 further includes a plurality of first extension pads 122 disposed above the first plugs 112 included in the plugs 410, and each of the first plugs 112 is in physical contact with a corresponding one of the first extension pads 122.

It is to be noted that the first border 126*a* of the extension margin 126 overlaps and physically contacts at least one of the second plugs 414 in the direction perpendicular to the substrate 100. In addition, at least one of the second extension pads 124, which are not in contact with the first border 126*a*, physically contacts two of the second plugs 414 with the insulating material and one of the first plugs 112 with the conductive material at the same time, as shown in FIG. 12. Accordingly, the dummy storage node plugs can be formed in the peripheral region 100B or the boundary area. Alternatively, the first border 126*a* of the extension margin 126 overlaps and physically contacts at least one of the second plugs 414 in the direction perpendicular to the substrate 100, and also contacts at least one of the second extension pads 124, which has been in physical contact with two of the second plugs 414, as shown in FIG. 13, so as to jointly form the dummy storage node plugs in the peripheral region 100B or the boundary area.

In this configuration of the semiconductor device 40 according to the fourth embodiment of the present invention, a plurality of dummy storage node plugs with different cross-sectional structures are formed by means of the first plugs 112, the second plugs 414, and the second extension pads 124 and the extension margin 126 disposed above the plugs. Although not specifically shown in the drawings, those skilled in the art can easily understand that one of the second plugs 414 and one of the third extension pads 128 in this embodiment may also jointly form a dummy storage node plug with a variable cross-sectional structure. Likewise, the structural defects of the semiconductor device 40 in this embodiment caused by a continuously increasing memory cell density can be ameliorated to have improved structure and performance. Meanwhile, the semiconductor device 40 may be formed with the capacitor structure 150 as shown in FIG. 4 in the storage region 100A in a subsequent process, and a plurality of vertical capacitors 152 of the capacitor structure 150 are made to be electrically connected to the first extension pads 122, respectively, thereby producing a dynamic random access memory device and achieving further improved operational performance. In the semiconductor device 40, more than one vertical capacitor 152 may be optionally disposed on one of the second extension pads 124 in contact with the first border 126*a*, and/or more than two vertical capacitors 152 may be optionally disposed on one of the second extension pad 124 not in contact with the first border 126*a*, but it is not limited to thereto.

Figure 14:
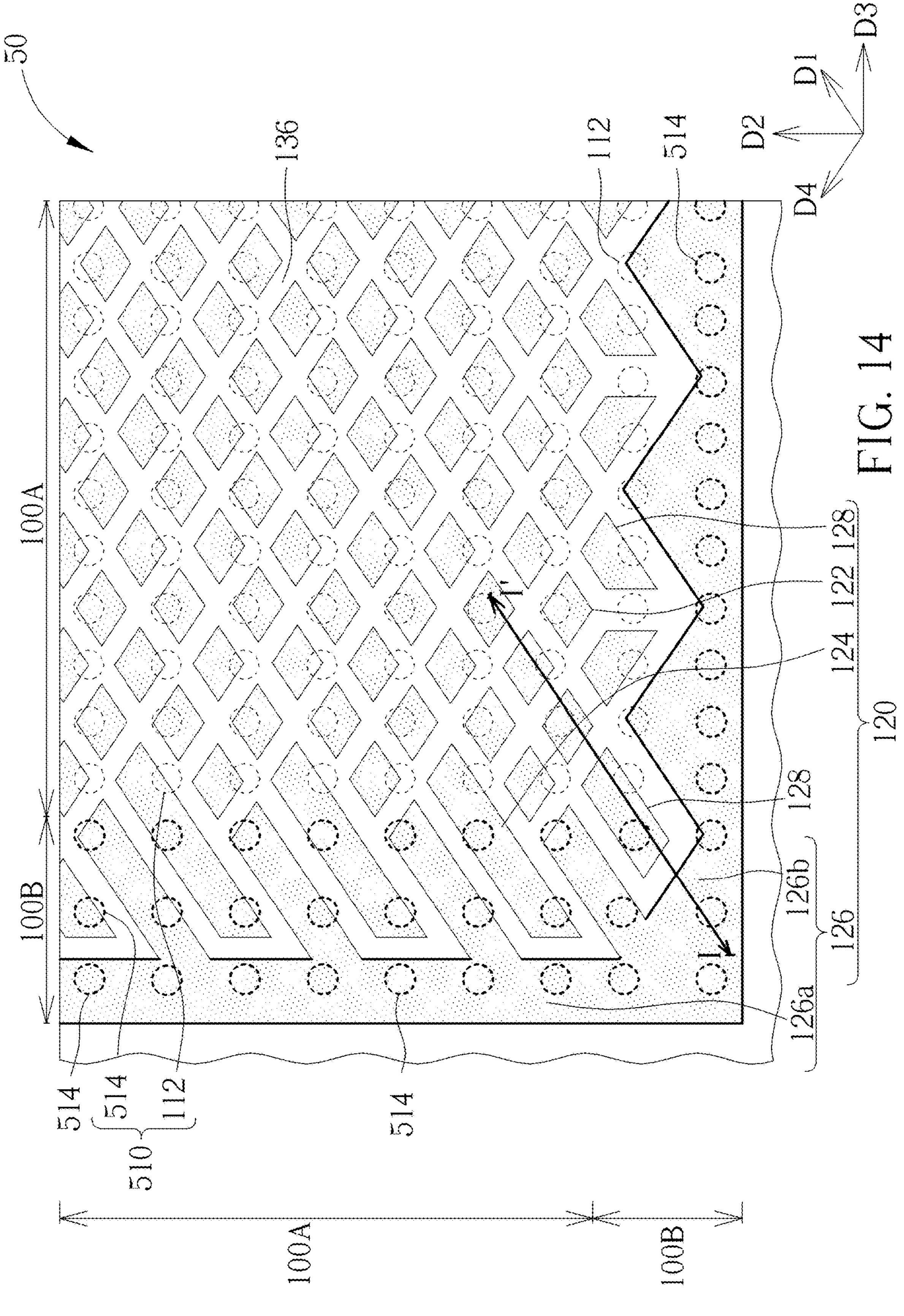
Figure 15:
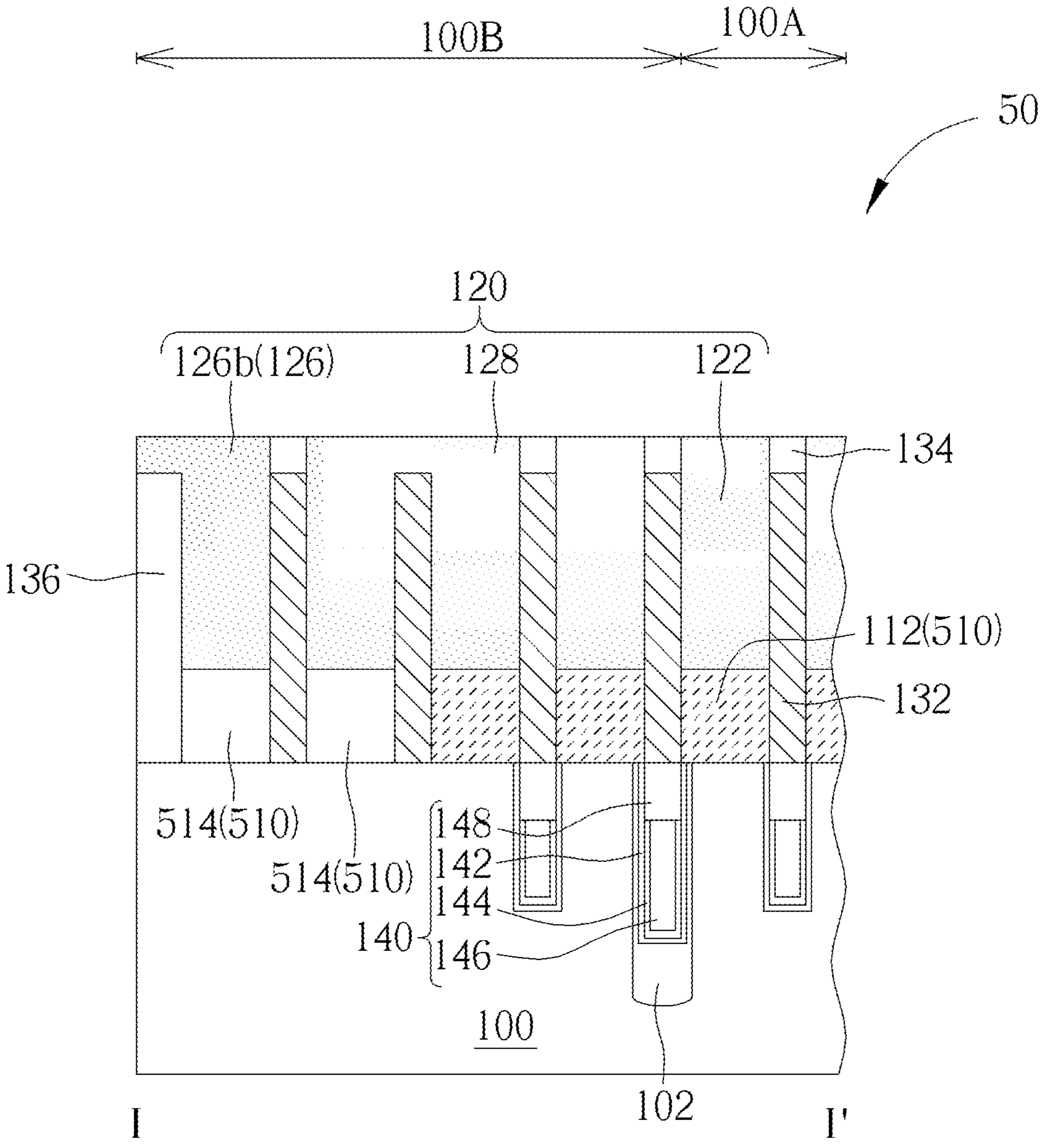

Refer to FIG. 14 to FIG. 15, which are schematic diagrams illustrating a semiconductor device 50 according to a fifth embodiment of the present invention. The semiconductor device 50 in this embodiment is basically similar to the semiconductor device 30 in the above-described embodiment, but mainly differs from the above-described embodiment in that a plurality of second plugs 514 are disposed and arranged in sequence along the second direction D2 and the third direction D3, respectively, and are in physical contact with the first border 126*a* and the second border 126*b* of the extension margin 126. Furthermore, the third extension pads 128 adjacent to the second border 126*b* are mainly in contact with the first plugs 112.

In detail, as shown in FIG. 14, plugs 510 of the semiconductor device 50 include a plurality of first plugs 112 with a conductive material, which are mainly disposed in the storage region 100A and physically contact the first extension pads 122, respectively. The plugs 510 further include the plurality of second plugs 514 with an insulating material, which are only disposed in the peripheral region 100B and physically contact the third extension pads 128 or the first border 126*a* or second border 126*b* of the extension margin 126. The plurality of second plugs 514 are disposed and arranged in sequence along the second direction D2 and the third direction D3, respectively, and are arranged in a plurality of columns or rows in the second direction D2 and the third direction D3, respectively. The number of the second plugs 514 arranged in columns is, for example, greater than the number of the second plugs 514 arranged in rows, but it is not limited thereto. It is to be noted that the second border 126*b* of the extension margin 126 overlaps and physically contacts at least one of the second plugs 514 in the direction perpendicular to the substrate 100. In addition, one of the third extension pads 128, which is not in contact with the second border 126*b*, is in physical contact with one of the second plugs 514 with the insulating material and one of the first plugs 112 with the conductive material at the same time, as shown in FIG. 15. Accordingly, the dummy storage node plugs can be formed in the peripheral region 100B or the boundary area.

In this configuration of the semiconductor device 50 according to the fifth embodiment of the present invention, a plurality of dummy storage node plugs with different cross-sectional structures are formed by means of the first plugs 112, the second plugs 514, and the third extension pads 128 and the extension margin 126 disposed above the plugs. In this way, the structural defects of the semiconductor device 50 in this embodiment caused by a continuously increasing memory cell density can be ameliorated to have improved structure and performance. Meanwhile, the semiconductor device 50 may be formed with the capacitor structure 150 as shown in FIG. 4 in the storage region 100A in a subsequent process, and a plurality of vertical capacitors 152 of the capacitor structure 150 are made to be electrically connected to the first extension pads 122, respectively, thereby producing a dynamic random access memory device and achieving further improved operational performance. In the semiconductor device 50, more than one vertical capacitor (not shown) may be optionally disposed on one of the third extension pads 128, which is not in contact with the first border 126*b*, but it is not limited to thereto.

Figure 16:
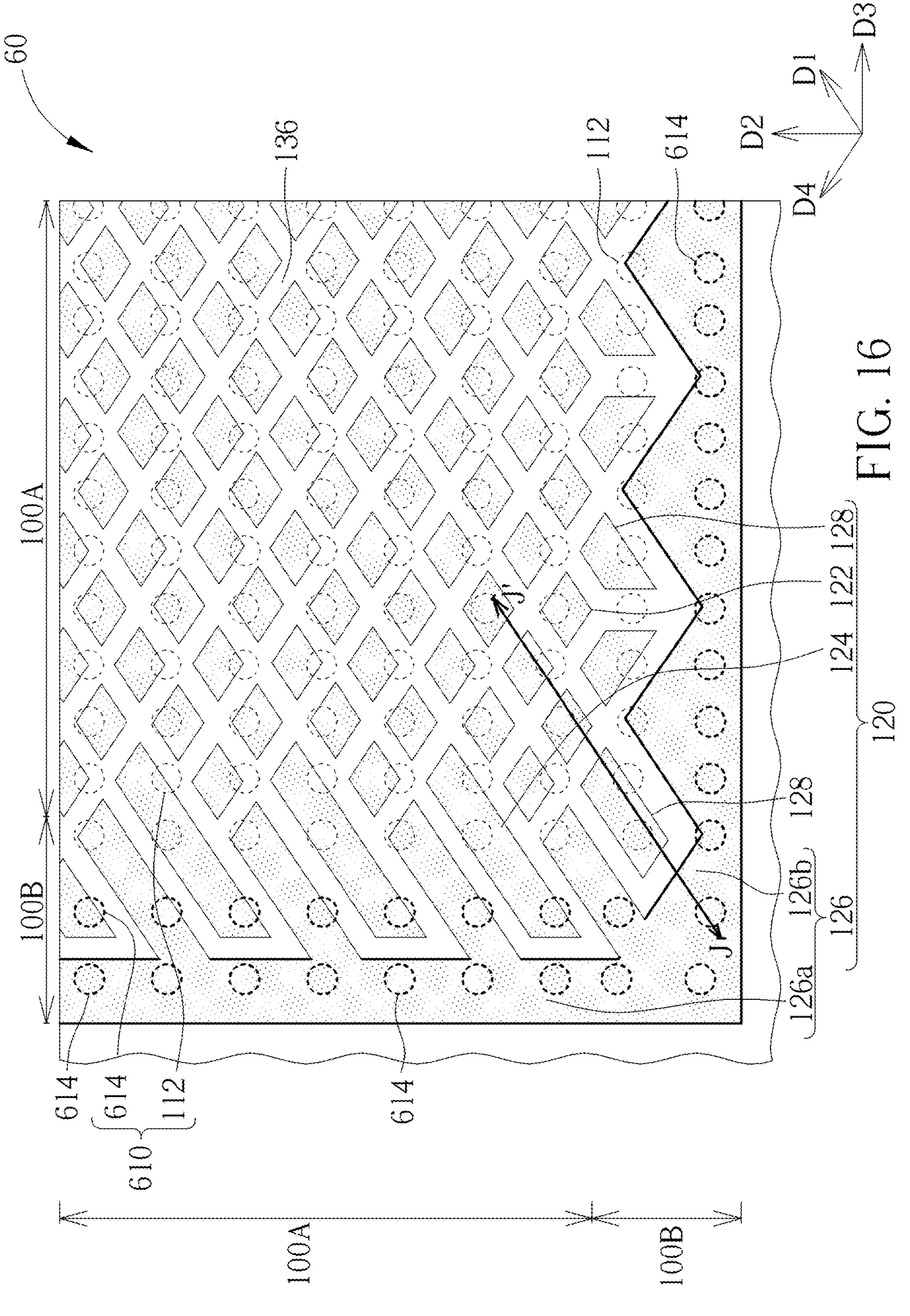
Figure 17:
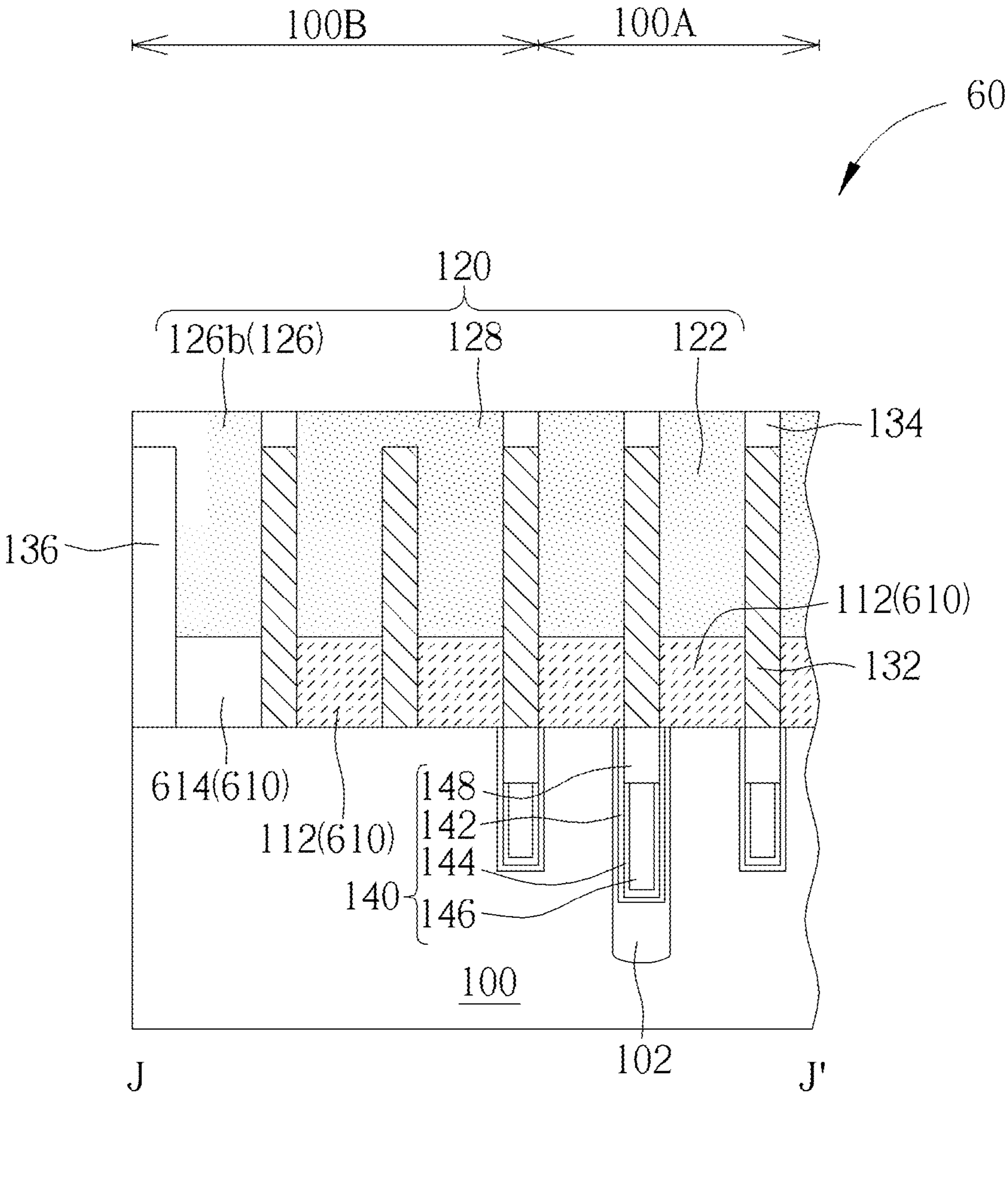

Refer to FIG. 16 to FIG. 17, which are schematic diagrams illustrating a semiconductor device 60 according to a sixth embodiment of the present invention. The semiconductor device 60 in this embodiment is basically similar to the semiconductor device 30 in the above-described embodiment, but mainly differs from the above-described embodiment in that a plurality of second plugs 614 are disposed and arranged in sequence along the second direction D2 and the third direction D3, respectively, and are in physical contact with the first border 126*a* and the second border 126*b* of the extension margin 126. Furthermore, the third extension pads 128 adjacent to the second border 126*b* are mainly in contact with the first plugs 112.

In detail, plugs 610 in this embodiment include a plurality of first plugs 112 with a conductive material and a plurality of second plugs 614 with an insulating material. Each of the first plugs 112 is in physical contact with the first extension pads 122, the second extension pads 124 or the third extension pads 128, and each of the second plugs 614 is in physical contact with the second extension pads 124 or in physical contact with the first border 126*a* or second border 126*b* of the extension margin 126. As shown in FIG. 16, the plurality of second plugs 614 are disposed and arranged in sequence along the second direction D2 and the third direction D3, respectively, and are arranged in a plurality of columns or rows in the second direction D2 and the third direction D3, respectively, in a manner of overlapping the first border 126*a* and the second border 126*b*. The number of the second plugs 614 arranged in columns is, for example, greater than the number of the second plugs 614 arranged in rows, but it is not limited thereto. It is to be noted that the second border 126*b* of the extension margin 126 overlaps and physically contacts at least one of the second plugs 614 in the direction perpendicular to the substrate 100. In addition, at least one of the third extension pads 128, which is not in contact with the second border 126*b*, is in physical contact with two of the first plugs 112 with the conductive material, as shown in FIG. 17. Accordingly, the dummy storage node plugs can be formed in the peripheral region 100B or the boundary area.

In this configuration of the semiconductor device 60 according to the sixth embodiment of the present invention, a plurality of dummy storage node plugs with different cross-sectional structures are formed by means of the first plugs 112, the second plugs 614, and the second extension pads 124, the extension margin 126 and the third extension pads 128 disposed above the plugs. In this way, the structural defects of the semiconductor device 60 in this embodiment caused by a continuously increasing memory cell density can be ameliorated to have improved structure and performance. Meanwhile, the semiconductor device 60 may be formed with the capacitor structure 150 as shown in FIG. 4 in the storage region 100A in a subsequent process, and a plurality of vertical capacitors 152 of the capacitor structure 150 are made to be electrically connected to the first extension pads 122, respectively, thereby producing a dynamic random access memory device and achieving further improved operational performance. In the semiconductor device 60, more than one vertical capacitor (not shown) may be optionally disposed on one of the third extension pads 128, which is not in contact with the first border 126*b*, but it is not limited to thereto.

In general, the semiconductor device according to the present invention is provided with extension pads and plugs with a conductive material and with an insulating material, which are combined to form a variety of structural configurations of dummy storage node plugs in the peripheral region or the boundary area. Each of the dummy storage node plugs is configured to include, for example, one of the second extension pads or one of the third extension pads in physical contact with the second plugs with the insulating material; one of the second extension pads or one of the third extension pads in physical contact with the second plugs with the insulating material and the first plugs with the conductive material at the same time; an extension margin in physical contact with the second plugs with the insulating material; or an extension margin in physical contact with the second extension pads. In this way, the dummy storage node plugs according to the present invention may be formed, without additional operational steps, to effectively ameliorate possible structural defects caused by a continuously increasing memory cell density, so as to form a semiconductor device with improved reliability of components. In addition, when photolithography processes of the plugs and the extension pads are performed for forming the dummy storage node plugs, it is desirable to maintain constant luminous flux even in areas with different component integration levels. It facilitates improvement of the yield of the semiconductor device according to the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
a plurality of plugs disposed on the substrate, and including a plurality of first plugs with a conductive material and a plurality of second plugs with an insulating material; and
a storage node pad structure disposed on the plurality of plugs, and comprising:
a plurality of first extension pads having a predetermined first length in a first direction, wherein the plurality of first extension pads are separated from each other and arranged as an array along the first direction, and one of the plurality of first extension pads is in physical contact with one of the plurality of first plugs; and
at least one second extension pad having a length greater than the predetermined first length in a plan view, wherein the at least one second extension pad is in physical contact with at least one of the plurality of second plugs.

2. The semiconductor device according to claim 1, wherein the at least one second extension pad is in physical contact with one of the plurality of first plugs and one of the plurality of second plugs.

3. The semiconductor device according to claim 1, wherein the at least one second extension pad is in physical contact with one of the plurality of first plugs or one of the plurality of second plugs.

4. The semiconductor device according to claim 1, wherein the at least one second extension pad is in physical contact with two of the plurality of first plugs or two of the plurality of second plugs.

5. The semiconductor device according to claim 1, further comprising:
an extension margin disposed around the outside of all the plurality of first extension pads and the at least one second extension pad, wherein the extension margin comprises at least one first border extending along a second direction and at least one second border extending along a third direction.

6. The semiconductor device according to claim 5, wherein the at least one second extension pad is in physical contact with the at least one first border.

7. The semiconductor device according to claim 5, wherein the at least one second extension pad is not in contact with the at least one first border or the at least one second border.

8. The semiconductor device according to claim 5, wherein the at least one second extension pad includes a plurality of second extension pads in contact with the at least one first border and a plurality of second extension pads not in contact with the at least one first border, and the plurality of second extension pads in contact with the at least one first border and the plurality of second extension pads not in contact with the at least one first border are arranged alternately at an interval in the second direction.

9. The semiconductor device according to claim 8, wherein a length of each of the plurality of second extension pads not in contact with the at least one first border in the first direction is greater than a length of each of the plurality of second extension pads in contact with the at least one first border.

10. The semiconductor device according to claim 5, wherein the extension margin is in physical contact with one of the plurality of first plugs or one of the plurality of second plugs.

11. A semiconductor device, comprising:
a substrate;
a plurality of plugs disposed on the substrate, and including a plurality of first plugs with a conductive material and a plurality of second plugs with an insulating material; and
a storage node pad structure disposed on the plurality of plugs, and comprising:
a plurality of first extension pads having a predetermined first length in a first direction, wherein the plurality of first extension pads are separated from each other and arranged as an array along the first direction, and one of the plurality of first extension pads is in physical contact with one of the plurality of first plugs; and at least one second extension pad having a length greater than the predetermined first length in a plan view; and an extension margin disposed around the outside of all the plurality of first extension pads and the at least one second extension pad, and comprising at least one first border extending along a second direction and at least one second border extending along a third direction, wherein the extension margin is in physical contact with at least one of the plurality of plugs.

12. The semiconductor device according to claim 11, wherein the extension margin is in physical contact with one of the plurality of first plugs or one of the plurality of second plugs.

13. The semiconductor device according to claim 11, wherein the at least one first border or the at least one second border of the extension margin is in physical contact with more than one of the plurality of second plugs at the same time.

14. The semiconductor device according to claim 11, wherein the extension margin is in physical contact with the at least one second extension pad, which is in physical contact with one of the plurality of first plugs or one of the plurality of second plugs, or which is in physical contact with one of the plurality of first plugs and one of the plurality of second plugs at the same time.

15. The semiconductor device according to claim 11, wherein the extension margin is not in contact with the at least one second extension pad, which is in physical contact with one of the plurality of first plugs and one of the plurality of second plugs at the same time, or which is in physical contact with one of the plurality of first plugs or one of the plurality of second plugs.

16. The semiconductor device according to claim 11, wherein the at least one second extension pad is in physical contact with at least one of the plurality of plugs and includes a plurality of second extension pads in physical contact with the at least one first border and a plurality of second extension pads not in contact with the at least one first border, and the plurality of second extension pads in contact with the at least one first border and the plurality of second extension pads not in contact with the at least one first border are arranged alternately at an interval in the second direction.

17. The semiconductor device according to claim 16, wherein a length of each of the plurality of second extension pads not in contact with the at least one first border in the first direction is greater than a length of each of the plurality of second extension pads in contact with the at least one first border.

18. A method of forming a semiconductor device, comprising:

providing a substrate;

forming a plurality of plugs on the substrate, the plurality of plugs including a plurality of first plugs with a conductive material and a plurality of second plugs with an insulating material; and forming a storage node pad structure on the plurality of plugs, the storage node pad structure comprising:

a plurality of first extension pads having a predetermined first length in a first direction, wherein the plurality of first extension pads are separated from each other and arranged as an array along the first direction, and one of the plurality of first extension pads is in physical contact with one of the plurality of first plugs; and a second extension pad having a length greater than the predetermined first length in a plan view, wherein the second extension pad is in physical contact with at least one of the plurality of plugs.

19. The method of forming a semiconductor device according to claim 18, further comprising:

depositing a conductive material layer on the plurality of plugs;

forming the second extension pad and the plurality of first extension pads by performing a self-aligned multi-patterning process to pattern the conductive material layer; and filling an insulating material layer into gaps among the second extension pad and the plurality of first extension pads.

20. The method of forming a semiconductor device according to claim 19, further comprising:

forming an extension margin on all the plurality of plugs while forming the second extension pad and the plurality of first extension pads, wherein the extension margin surrounds all the plurality of first extension pads and the second extension pad, and the extension margin comprises at least one first border extending along a second direction and at least one second border extending along a third direction.

* * * * *